United States Patent
Yang et al.

[19]

[11] Patent Number: 6,146,461
[45] Date of Patent: Nov. 14, 2000

[54] CHEMICAL VAPOR DEPOSITION APPARATUS HAVING A GAS DIFFUSING NOZZLE DESIGNED TO DIFFUSE GAS EQUALLY AT ALL LEVELS

[75] Inventors: Chang-Zip Yang, Kyungki-do; Tae-Chul Kim; Jae-Hyuck An, both of Suwon, all of Rep. of Korea

[73] Assignee: Samsung Electronics Co., Ltd., Suwon, Rep. of Korea

[21] Appl. No.: 09/497,496

[22] Filed: Feb. 4, 2000

[30] Foreign Application Priority Data

Sep. 17, 1999 [KR] Rep. of Korea ...................... 99-40069

[51] Int. Cl.⁷ ........................... C23C 16/00; C23C 16/445
[52] U.S. Cl. ............................ 118/715; 432/235
[58] Field of Search ............................ 118/715; 432/239, 432/245; 239/145, 547, 550

[56] References Cited

U.S. PATENT DOCUMENTS

| | | | |
|---|---|---|---|
| 5,001,327 | 3/1991 | Hirasawa et al. | 219/390 |
| 5,146,869 | 9/1992 | Bohannon et al. | 118/724 |
| 5,711,816 | 1/1998 | Kirlin et al. | 118/726 |
| 6,022,414 | 2/2000 | Miller | 118/718 |

FOREIGN PATENT DOCUMENTS 10-26780  2/1986  Japan .

*Primary Examiner*—Gregory Mills
*Assistant Examiner*—Sylvia R. MacArthur
*Attorney, Agent, or Firm*—Jones Volentine, LLC

[57] ABSTRACT

A chemical vapor deposition apparatus includes a processing chamber formed by an external tube, and an internal tube installed inside the external tube, a wafer boat securable within the processing chamber, and a single gas diffusing nozzle extending vertically within the processing chamber. The gas diffusing nozzle includes an outer tubular member having a closed top end, a diaphragm dividing the interior of the tubular member into two regions disposed side by side, and columns of gas diffusing openings extending through the tubular member on opposite sides of the diaphragm, respectively. The gas infused through the gas diffusing nozzle is forced by the diaphragm to rise up one side region of the tubular member and then descend through the other side region. In this way, the gas is evenly distributed to the wafers situated in the boat. Accordingly, the reaction time necessary for the gas to form identical layers on the wafers is minimized, the quality and reliability of the wafers is improved, and the production rate is increased.

4 Claims, 5 Drawing Sheets

CHEMICAL VAPOR DEPOSITION APPARATUS HAVING A GAS DIFFUSING NOZZLE DESIGNED TO DIFFUSE GAS EQUALLY AT ALL LEVELS

BACKGROUND OF THE INVENTION

1. Field of the Invention

The present invention relates to a chemical vapor deposition (CVD) apparatus used in the manufacturing of a semiconductor memory device. More particularly, the present invention relates to the gas diffusing nozzle of the apparatus from which gas diffuses so as to become deposited on the surfaces of wafers loaded in the apparatus.

2. Description of the Related Art

In general, in the process of fabricating a semiconductor device, a layer to be used as a dielectric or conductive material of the device is formed on the surface of a wafer by diffusing a gaseous chemical (vapor) onto the wafer, thereby facilitating a chemical reaction in which the layer is formed. The chemical vapor deposition processes available for forming such a dielectric or conductive layer can be classified as air pressure chemical vapor deposition, low pressure chemical vapor deposition or high pressure chemical vapor deposition.

In particular, low pressure chemical vapor deposition occurs at a pressure of 0.1 to 100 Torr. In addition to pressure, the temperature, the wafer gap, the quantity of the diffusing gas, and the like, are factors which affect the uniformity of the resultant layer of each wafer.

Chemical vapor deposition is carried out in a CVD apparatus comprising a quartz tube within which a plurality of wafers are loaded. The apparatus also includes a plurality of gas diffusing nozzles through which the process gas is supplied, and a discharge outlet through which gas in the tube is discharged from the tube.

FIG. 1 illustrates a conventional chemical vapor deposition apparatus. The apparatus includes an external quartz tube 10 and an internal quartz tube 11 disposed inside of and spaced from the external tube 10 so that a predetermined gap is provided therebetween. The top of the internal tube 11 is open. A wafer boat 12, defining slots which accommodate a plurality of wafers, respectively, is provided within the internal tube 11.

The CVD apparatus also includes a plurality of gas diffusing nozzles 13, 14, 15 leading into the space in which the wafers are positioned from a location underneath the external tube 10. The gas diffusing nozzles 13, 14, 15 are of different heights within the internal tube 11 so that the gas supplied through the nozzles will be distributed evenly over the wafers situated in the wafer boat 12.

Furthermore, the discharge outlet 16 is located across from the gas diffusing nozzles 13, 14, 15 at the other side of the external tube 10. A bell jar 17 covers the external tube 10 and is provided with a heater.

However, the prior art of the chemical vapor deposition apparatus is problematic in that it comprises a plurality of gas diffusing nozzles of different heights which will distribute the process gas to different levels irrespective of the location of wafers in the boat. The use of such an apparatus can give rise to variations in the density of the gas in the tube and an irregular chemical vapor deposition rate. Furthermore, the apparatus, which relies on a plurality of gas diffusing nozzles, has a correspondingly complex structure.

One proposal to solve the aforementioned problems, as shown in FIG. 2, is to employ only one gas diffusing nozzle 20 having a plurality of gas diffusing openings 21. However, this proposal still has problems. The quantity of gas which diffuses through the openings varies according to the height at which the gas diffusing opening is located. That is, the further up the gas diffusing opening is located in the nozzle, the smaller is the quantity of gas which will diffuse through the opening during a given time of operation. The density of the gas filling the internal tube decreases in a direction toward the top of the tube, and accordingly, the rate at which layers are formed on the surface of the wafers varies amongst the wafers situated in the boat. Hence, the resultant layers on the wafers do not have the same thickness.

SUMMARY OF THE INVENTION

Therefore, it is an object of the present invention to solve the aforementioned problems of the prior art and provide a chemical vapor deposition apparatus having only one gas diffusing nozzle installed therein which nonetheless causes the gas to be uniformly diffused therefrom, whereby the density of the gas inside the process chamber tube is uniform and the resultant layers formed on the surfaces of the wafers have identical thicknesses.

In order to achieve this object, the present invention provides chemical vapor deposition apparatus comprising a gas diffusing nozzle extending vertically within the processing chamber, the gas diffusing nozzle having two columns of openings, and partitioning members which cause the gas entering the nozzle to sequentially flow upwardly past only one of the columns of gas diffusing openings and then downwardly past the other column of gas diffusing openings.

The gas diffusing nozzle includes a tubular member having a closed top end. The partitioning members include a diaphragm disposed within the tubular member and extending vertically therein so as to laterally divide an interior space of the tubular member into two regions located on opposite sides of the diaphragm, respectively, and a partition extending between the diaphragm and the tubular member at the bottom of only one of the two regions. The first column of gas diffusing openings extends through the tubular member from one of the regions, whereas the second column of gas diffusing openings extends through the tubular member from the other of the regions.

Therefore, the gas infused through the gas diffusing nozzle first rises on one side of the diaphragm while partially diffusing through one of the columns of gas diffusing openings, and then descends on the other side of the diaphragm and diffuses through the other column of gas diffusing openings. In this way, the gas is evenly distributed through the gas diffusing openings and the density of the gas infused into the processing chamber is kept uniform.

BRIEF DESCRIPTION OF THE DRAWINGS

Other objects, features and advantages of the invention will become more apparent from the following detailed description of embodiments thereof made with reference to the accompanying drawings, of which.

DETAILED DESCRIPTION OF THE PREFERRED EMBODIMENTS

Preferred embodiments of the present invention will be described in detail with reference to FIGS. 3–6.

Figure 1:
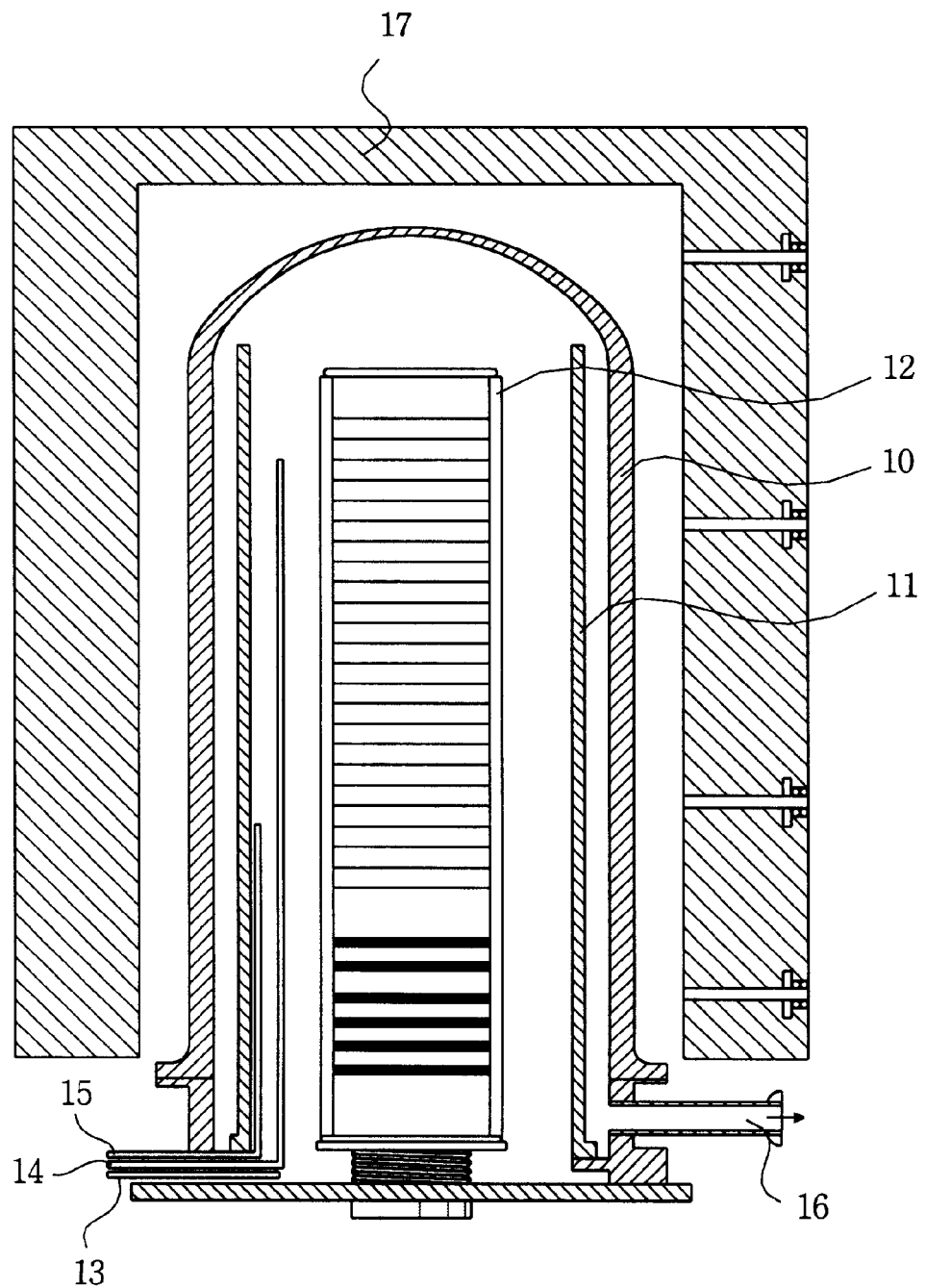
FIG. 1 is a longitudinal sectional view of conventional chemical vapor deposition apparatus.
Figure 2:
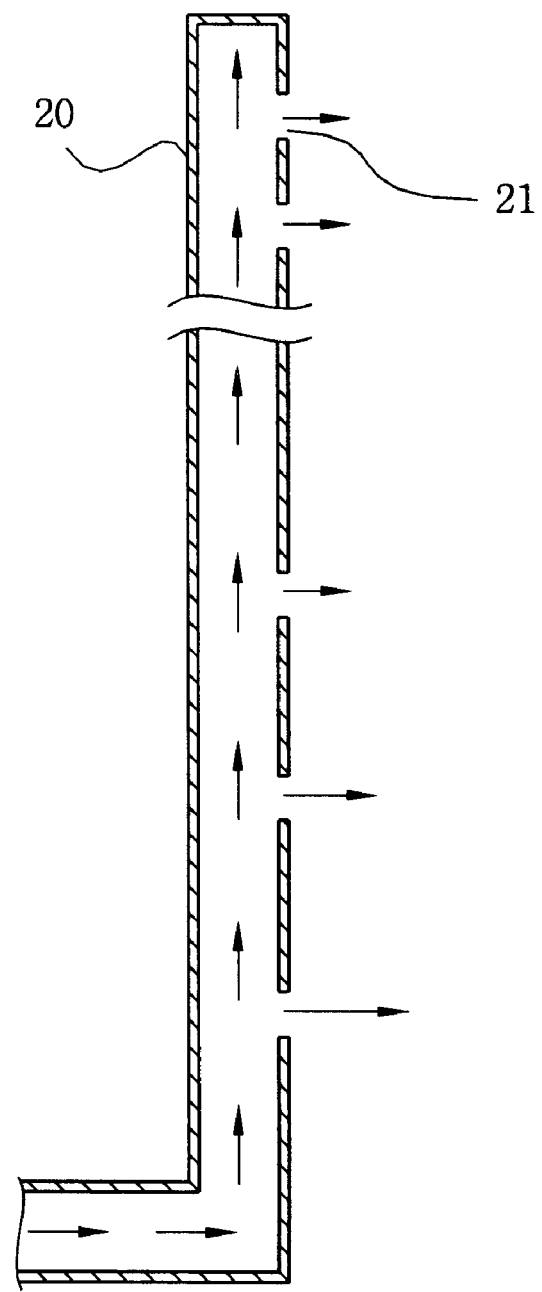
FIG. 2 is a longitudinal sectional view of a gas diffusing nozzle for use in the conventional chemical vapor deposition apparatus.
Figure 3:
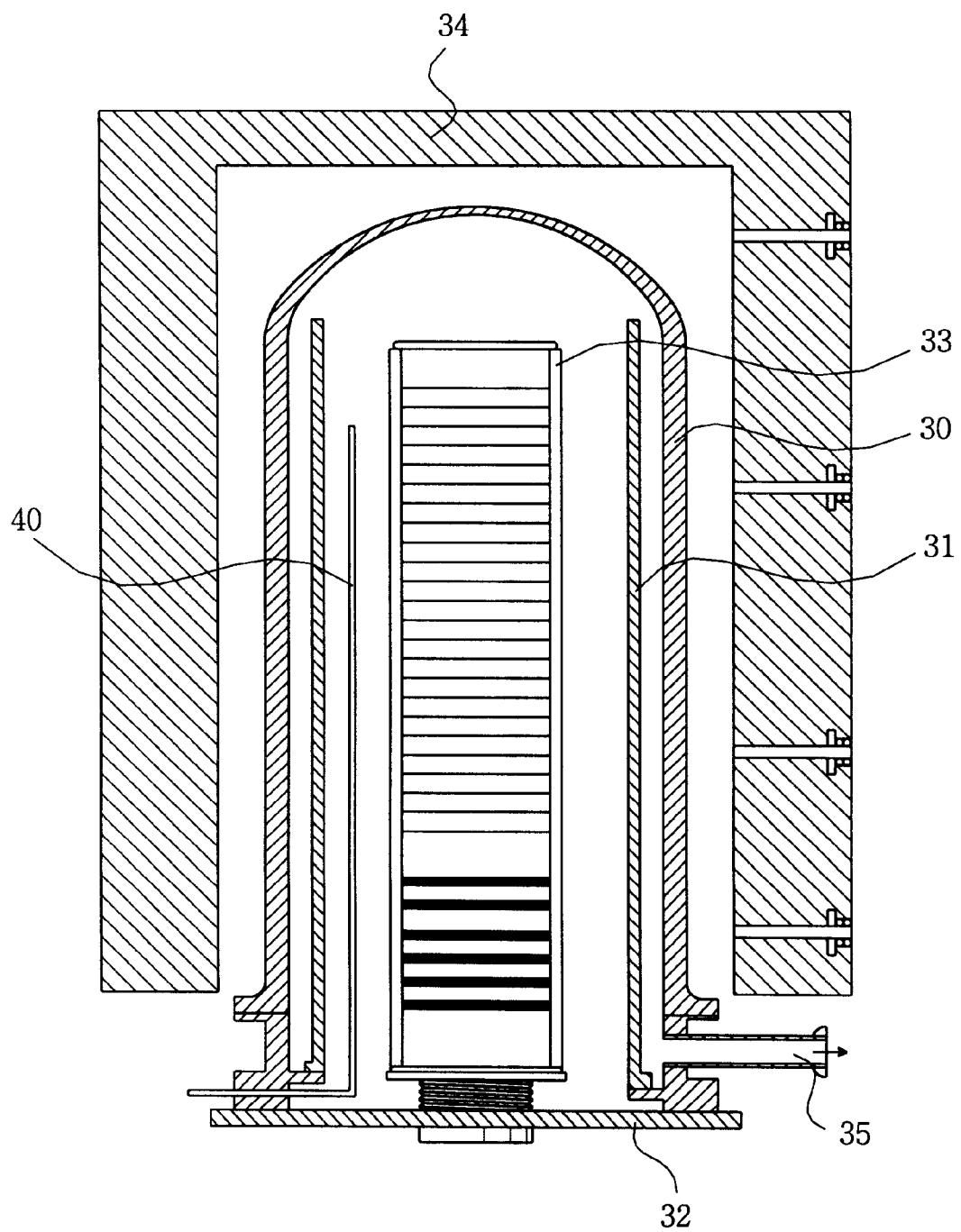
FIG. 3 is a longitudinal sectional view of an embodiment of chemical vapor deposition apparatus according to the present invention.

Referring first to FIG. 3, there is shown a processing chamber and a gas diffusing nozzle extending vertically within the processing chamber. The processing chamber includes an external tube 30 made of quartz, or the like, extending axially in a vertical direction, and at least one internal tube 31 also extending axially in the vertical direction. The internal tube 31 is disposed radially inwardly of and spaced from the external tube 30. The internal tube 31 also has an open top portion. A rotary table 32 is disposed at the bottom of the processing chamber and is rotated by a rotary driving mechanism (not shown). A boat 33 is secured on the table 32 and defines a series of vertically spaced apart slots configured to accommodate a plurality of wafers. Furthermore, a bell jar 34 equipped with a heater is disposed over the external tube 30.

Next, only a single gas diffusing nozzle extends into the external tube 30 for supplying the process gas to the wafers. A discharge outlet 35 is formed across from an infusing part of the gas diffusing nozzle at the other side of the external tube 30.

Figure 4:
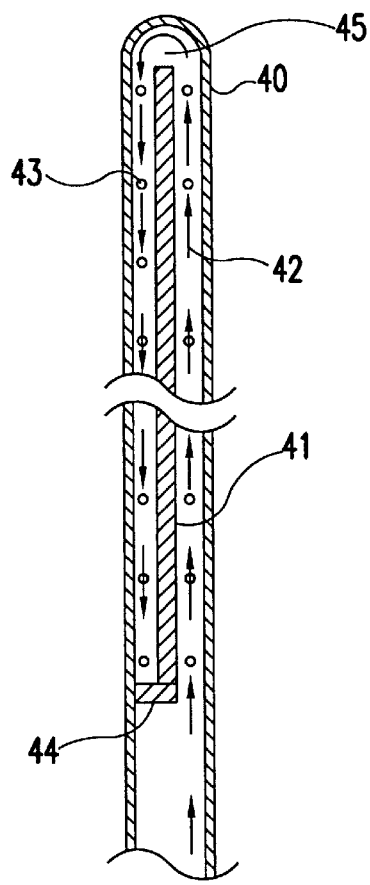
FIG. 4 is a longitudinal sectional view of the top portion of a gas diffusing nozzle of the chemical vapor deposition apparatus according to the present invention.
Figure 5:
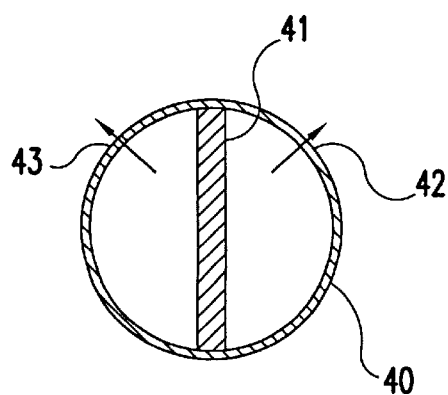
FIG. 5 is a cross-sectional view of the top portion of the gas diffusing nozzle.

As shown in FIGS. 4 and 5, the gas diffusing nozzle includes an outer tubular member 40, a diaphragm 41 extending within and along the axial middle of the tubular member 40 so as to divide its internal space into two regions separated laterally from one another, and a partition 44 extending between the entirety of one side of the diaphragm 41 and the tubular member 40 at the bottom of only one of the two regions. The top portion of the diaphragm 41 is spaced a predetermined amount from the upper closed end of the tubular member 40 so as to define a passageway 45 connecting the two regions separated laterally from one another by the diaphragm.

Figure 6:
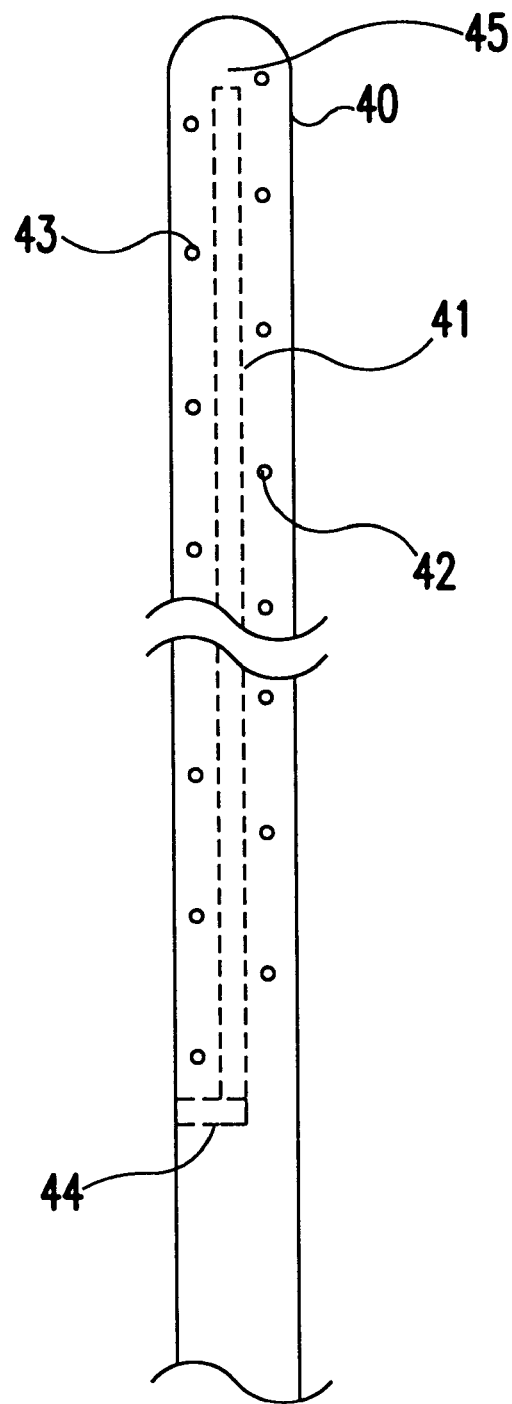
FIG. 6 is a longitudinal sectional view of the top portion of another embodiment of a gas diffusing nozzle of the chemical vapor deposition apparatus according to the present invention.

The gas diffusing nozzle also has two columns of gas diffusing openings 42, 43 formed in the tubular member 40 for diffusing gas toward the wafers loaded in the boat 33 over a predetermined angle whose vertex is located on the diaphragm 41. The columns of the gas diffusing openings 42, 43 are parallel. In the gas diffusing nozzle shown in FIG. 4, the gas diffusing openings 42 in one column are provided at the same levels, respectively, as the gas diffusing openings 43 in the other column. Alternatively, as shown in FIG. 6, the gas diffusing openings 42 in one column are vertically offset, respectively, from the gas diffusing openings 43 in the other column, whereby the openings 42, 43 are collectively arranged along a zig-zag from top to bottom.

Preferably, the gas diffusing openings 42, 43 are located at the same levels as the wafer slots in the wafer boat 33.

The quantity of gas diffused through each opening (gas discharge rate) decreases the further the gas diffusing opening is located from the infusing part of the nozzle (the inlet end at which the gas enters the vertical part of the nozzle) in the direction of gas flow through the nozzle. The diaphragm 41 and partition 44 create a path for the gas flow beginning at the lowermost gas diffusing opening 42 and ending at the lowermost gas diffusing opening 43. Therefore, the greatest amount of gas diffuses through the lowermost gas diffusing opening 42 of one column of openings, and the smallest amount of gas diffuses through the lowermost gas diffusing opening 43 of the other column of openings. The openings 42 and 43 which are just above the lowermost openings 42 and 43 diffuse, respectively, the second greatest quantity of gas and the next to smallest quantity of gas amongst all the openings, and so on. Therefore, the total quantity of the gas diffusing from all levels of the gas diffusing nozzle is essentially the same, whereby the pressure of the gas is uniform when measured vertically at the exterior of the gas diffusing nozzle. Therefore, the density of the gas in the external tube 30 will be uniform in the vertical dimension of the apparatus.

The chemical vapor deposition apparatus of the present invention operates as follows. The boat 33 loaded with a plurality of wafers is securely fixed on the rotating table 32. The rotary driving mechanism is activated to rotate the rotating table 32. At this time, gas is infused into the gas diffusing nozzle in order for a chemical vapor to be deposited onto the surface of the wafers.

The gas infused into the tubular member 40 of the gas diffusing nozzle rises up along a path in one region in the tubular member 40 during which time some of the gas diffuses through the gas diffusing openings 42. The remaining gas descends along another path formed in the other region in the tubular member 40 whereupon the gas diffuses through the gas diffusing openings 43. More specifically, the partition 44 and diaphragm 41 force the gas infused into the gas diffusing nozzle to rise in the region within the tubular member 40 open to the first column of gas diffusing openings 42, flow through passageway 45, and then descend back down in the region within the tubular member 40 open to the second column of gas openings 43.

The pressure of the gas diffusing through the gas diffusing openings 42, 43 of the gas diffusing nozzle 40 varies according to the proximity of the gas diffusing opening to the inlet end of the nozzle. That is, the pressure of the gas is highest at the lowermost gas diffusing opening 42 positioned closest to the gas infusing part. On the contrary, the pressure of the gas is the lowest at the lowermost gas diffusing opening 43 which is located at the downstream end of the flow path. As a result, the total pressure of the gas diffusing at each vertical level of the openings 42, 43 is identical.

As the gas diffuses through the gas diffusing openings 42, 43 horizontally toward the wafers in the boat 33, the density of the gas in the processing chamber will remain uniform throughout. The reaction time needed to form a desired layer at the surface of each of the wafers can thus be kept to a minimum.

After the gas is deposited onto the surface of the wafers situated in the boat 33, the gas is discharged out of the processing chamber via the discharge outlet 35 positioned across from the infusing part of the gas diffusing nozzle 40.

As can be understood from the description above, the present invention is advantageous in that it possesses a relatively simple structure as afforded by the single gas diffusing nozzle, and nonetheless keeps the density of the gas diffused into the processing chamber uniform, thereby minimizing the reaction time necessary to form layers of desired uniform thickness on the wafers, increasing the yield, and improving the quality and reliability of the devices manufactured from the wafers. Furthermore, although the present invention has been described above in connection with the preferred embodiments thereof, various changes thereto and modifications thereof will become apparent to those of ordinary skill in the art. All such changes and modifications are seen to be within the true spirit and scope of the invention as defined by the appended claims.

What is claimed is:

1. A chemical vapor deposition apparatus comprising:

a processing chamber;

a wafer boat disposed within said processing chamber, said boat being configured to support a plurality of wafers disposed one above the other; and a gas diffusing nozzle extending vertically within said processing chamber, said gas diffusing nozzle including a tubular member having a closed top end, a diaphragm disposed within said tubular member and extending vertically therein so as to laterally divide an interior space of said tubular member into two regions located on opposite sides of the diaphragm, respectively, a first column of gas diffusing openings extending through said tubular member from one of said regions, a second column of gas diffusing openings extending through said tubular member from the other of said regions, a gas passageway extending between and open to said two regions adjacent the closed top end of said tubular member, and a partition extending between said diaphragm and said tubular member at the bottom of only one of said two regions.

2. The chemical vapor deposition apparatus as claimed in claim 1, wherein the gas diffusing openings of said first column lie along a first straight line, and said gas diffusing openings of said second column lie along a second straight line parallel to said first straight line.

3. The chemical vapor deposition apparatus as claimed in claim 1, wherein the gas diffusing openings of said first column are disposed at the same level, in the vertical direction, as the gas diffusing openings of said second column, respectively.

4. The chemical vapor deposition apparatus as claimed in claim 1, wherein the gas diffusing openings of said first column are vertically offset, respectively, from the gas diffusing openings of said second column, whereby the gas diffusing openings are collectively arranged along a zig-zagging path in the vertical direction.

* * * * *